(12) United States Patent
Loui et al.

(10) Patent No.: US 10,218,068 B1
(45) Date of Patent: Feb. 26, 2019

(54) IN-SITU ACTIVE IMPEDANCE CHARACTERIZATION OF SCANNED ARRAY ANTENNAS

(71) Applicant: National Technology & Engineering Solutions of Sandia, LLC, Albuquerque, NM (US)

(72) Inventors: Hung Loui, Albuquerque, NM (US); Thomas Edward Christian, Jr., Palmdale, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 453 days.

(21) Appl. No.: 14/927,018

(22) Filed: Oct. 29, 2015

(51) Int. Cl.
| | | |
|---|---|---|
| *H01Q 3/00* | (2006.01) | |
| *H01Q 3/26* | (2006.01) | |
| *H01Q 3/34* | (2006.01) | |
| *G01R 29/10* | (2006.01) | |

(52) U.S. Cl.
CPC ............ *H01Q 3/267* (2013.01); *G01R 29/10* (2013.01); *H01Q 3/34* (2013.01)

(58) Field of Classification Search
CPC ........... H01Q 3/34; H01Q 3/267; H01Q 3/385
USPC ................. 342/81, 154, 157, 368, 371, 373; 455/101, 103; 375/349
See application file for complete search history.

(56) References Cited

U.S. PATENT DOCUMENTS

| | | | | |
|---|---|---|---|---|
| 6,091,788 A | * | 7/2000 | Keskitalo ................. | H04B 7/10 342/373 |
| 2015/0325913 A1 | * | 11/2015 | Vagman ............... | H01Q 3/2605 342/368 |
| 2017/0117950 A1 | * | 4/2017 | Strong ................. | H04B 7/0682 |
| 2017/0163327 A1 | * | 6/2017 | Yang .................... | H04B 7/0413 |

OTHER PUBLICATIONS

Christian, et al., "A New Approach for in-situ Active Impedance Characterization of Scanned Antenna Arrays", Antennas and Propagation Society International Symposium (APSURSI)—IEEE, Jul. 2013, pp. 304-305.
D. M. Pozar, "The Active Element Pattern," IEEE Transactions on Antennas and Propagation, vol. 42, No. 8, pp. 1776-1778, 1994.
Rytting, Doug, "Network Analyzer Error Models and Calibration Methods", Retrieved at <<http://www.uta.edu/faculty/jcchiao/class/EE3407_2014_fall/NA_Error_Models_and_Cal_Methods.pdf>>, Retrieval Date: Dec. 23, 2014, pp. 1-43.

* cited by examiner

*Primary Examiner* — Dao L Phan
(74) *Attorney, Agent, or Firm* — Medley, Behrens & Lewis, LLC

(57) ABSTRACT

Various embodiments presented herein relate to determining mutual coupling between a pair of antennas in an array antenna. Various operations presented herein enable comparison between a magnitude and phase of a signal transmitted from a first feed network (via a first antenna) and a magnitude and phase of a portion of the signal received at a second feed network (via a second antenna). Electrical effects engendered by any of the first feed network, a first switch, a first local circuit, the second feed network, a second switch, and a second local circuit can also be determined and their effects mathematically removed. Based upon the foregoing, a mutual coupling between the pair of antenna is determined.

9 Claims, 13 Drawing Sheets

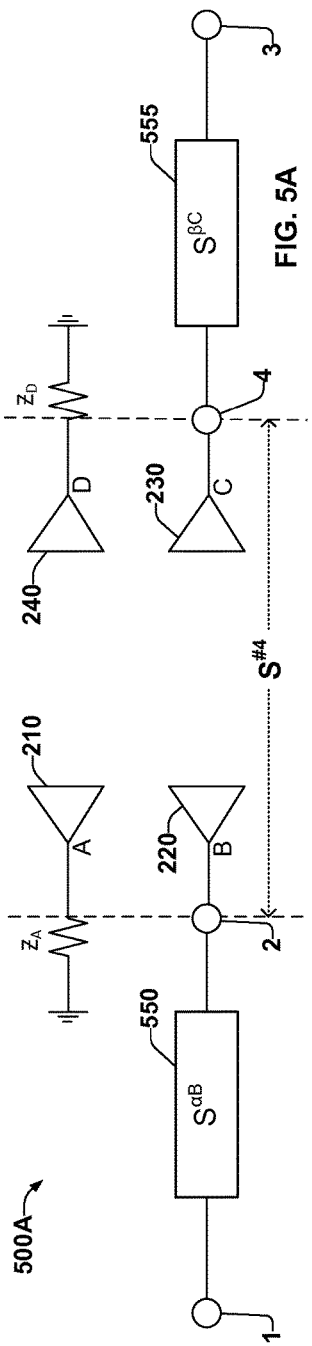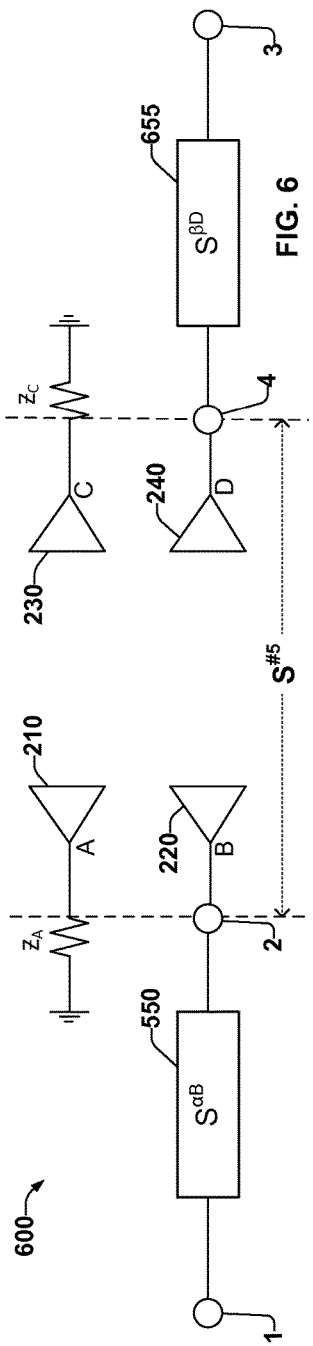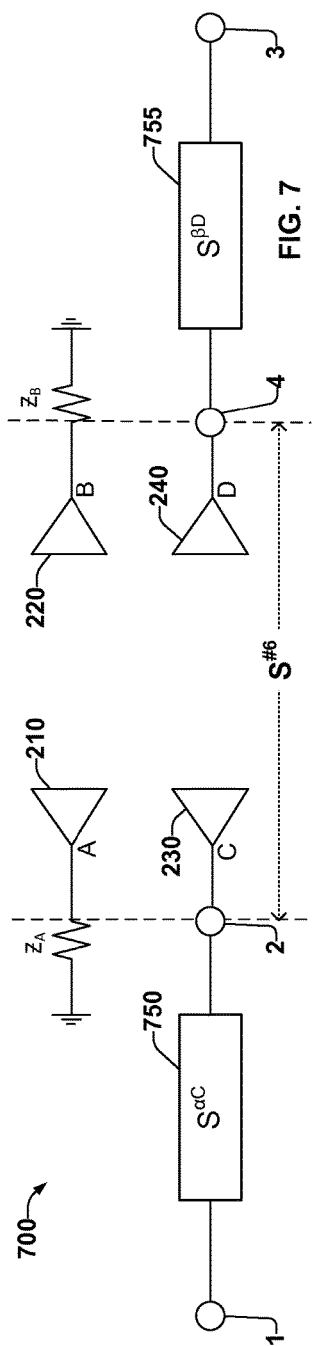

IN-SITU ACTIVE IMPEDANCE CHARACTERIZATION OF SCANNED ARRAY ANTENNAS

STATEMENT OF GOVERNMENTAL INTEREST

This invention was developed under contract DE-AC04-94AL85000 between Sandia Corporation and the U.S. Department of Energy. The U.S. Government has certain rights in this invention.

BACKGROUND

An array antenna (e.g., a phased array antenna) comprises a plurality of antenna elements arranged on a grid, or similar layout. The antenna elements can transmit and/or receive respective signals to form a coherent signal having a particular radiation pattern. The coherent signal can be steered in a particular direction by delaying transmission and/or reception of at least one antenna element relative to another antenna element.

Owing to proximity between antenna elements in an array, mutual coupling between antenna elements can occur, which (if unaccounted for) can deleteriously affect operation of the array antenna.

Conventionally, to measure the mutual coupling between various antenna elements in an array, measurements can be taken between each and every pair of antenna elements. For example, a first channel of instrumentation (e.g., a network analyzer) can be connected to a first port of the array antenna connected to a first antenna element, and a second channel of the instrumentation can be connected to a different port connected to a second antenna element. A signal can be transmitted by the first antenna element, whereby a measurement can be taken (e.g., by the network analyzer) at the second antenna element to determine a mutual coupling occurring between the first antenna element and the second antenna element. The process can be repeated until the mutual coupling between all of the antenna element pairings is determined. With an array comprising a small number of antenna elements, such a conventional operation can be easily performed. However, in an array comprising a large number of antenna elements, e.g., 1,000 antenna elements, the task would soon become time consuming, as well as tedious. A multi-channel network analyzer (e.g., comprising 16 ports or channels) can be utilized to speed up the process by connecting a number of antenna elements concurrently. However, as more channels are incorporated into a multi-channel network analyzer there is a corresponding increase in cost, such that the cost of such a network analyzer may become prohibitive.

SUMMARY

The following is a brief summary of subject matter that is described in greater detail herein. This summary is not intended to be limiting as to the scope of the claims.

A plurality of embodiments are presented herein relating to determining mutual coupling effects between a plurality of antenna elements in a phased array antenna. The plurality of antenna elements can be coupled to a plurality of local circuits and switches, enabling the plurality of antenna elements to be switched between either a first feed network, a second feed network, or a termination impedance to ground. Although for purposes of mutual coupling characterization, a minimum of two feed networks is required, either the first feed network or the second feed network may be utilized during array operation or additional feed networks can be switched in.

Each local circuit can be connected to a contact of a switch, whereby in an embodiment, each switch can be a triple (or more) throw switch. A first contact of the switch can be connected to the first feed network (first switch position), a second contact of the switch can be connected to the second feed network (second switch position), and a third contact of the switch can be connected via a termination impedance to ground (third switch position). Additional switch positions may be connected to additional feed networks as required for array operation. Initially, no antenna elements are connected to the local circuits, whereby each switch is switched to the third switch position enabling electrical characteristics of the impedance terminations through the switches to be determined.

Antenna elements can subsequently be attached to the local circuits, whereby individual pairs of antenna elements are subsequently characterized while all other antenna elements are switched via termination impedance to ground. The characterization can involve the following:

The first feed network (via a first switch and a first local circuit) is switched to a first antenna element, and a first electrical characterization is obtained between the sum-port of the first feed network and the single-pole port of the first switch leading to the first antenna element.

A second feed network (via a second switch and a second local circuit) is switched to a second antenna element, and a second electrical characterization is obtained between the sum-port of the second feed network and the single-pole port of the second switch leading to the second antenna element.

A third electrical characterization can be performed, whereby a signal is generated at the first feed network, transmitted via the first antenna element to the second antenna element, and received at the second antenna element, whereby a magnitude(s) and phase(s) or amplitude(s) of the transmitted, reflected, and received signal(s) can be determined. The signal received at the second antenna element is a portion of the signal transmitted at the first antenna element (and vice versa).

A mutual coupling between the first antenna element and the second antenna element can be determined based upon the third electrical characterization in conjunction with the first and second electrical characterizations.

The above operation(s) can be repeated for each pair of antenna elements in the phased array antenna. Any antenna elements which are not being characterized can be switched (e.g., via impedance termination) to ground to enable isolation of the pair of antenna elements for which mutual coupling is being measured. By utilizing the various operations presented herein and upon further data processing (e.g., renormalization, assembly, and renormalization), it is possible to measure the magnitude and phase or amplitude of the signal transmitted from a first feed network (via a first antenna element) and received at a second feed network (via a second antenna element), and to further extract electrical effects engendered by any of the first feed network, the first switch, the first local circuit, the second feed network, the second switch, and the second local circuit, thereby enabling the mutual coupling between the pair of antenna elements to be determined.

Based upon the various mutual couplings between respective antenna elements, a respective signal driving each antenna element can be adjusted to compensate for the various mutual couplings, thereby enabling a defined radiation pattern to be achieved.

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

BRIEF DESCRIPTION OF THE DRAWINGS

FIG. 5A presents a schematic of measurement of mutual coupling between a fourth pair of antenna elements.

FIG. 6 presents a schematic of measurement of mutual coupling between a fifth pair of antenna elements.

FIG. 7 presents a schematic of measurement of mutual coupling between a sixth pair of antenna elements.

DETAILED DESCRIPTION

Figure 1:
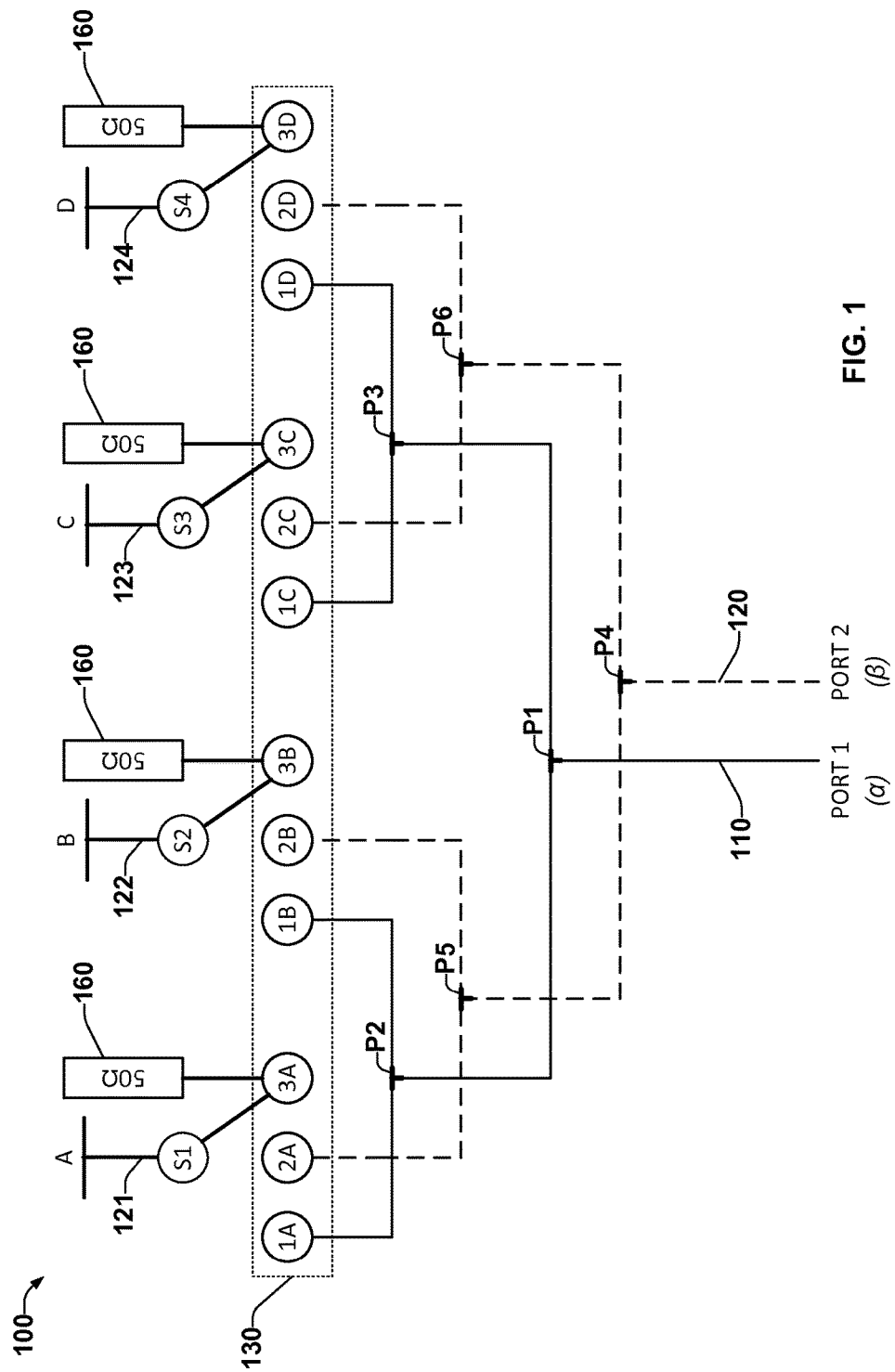
FIG. 1 illustrates an exemplary system for characterizing mutual coupling between pairs of antenna elements in a first configuration.

Various technologies pertaining to determining mutual coupling in an array antenna are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects.

Further, the term "or" is intended to mean an inclusive "or" rather than an exclusive "or". That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form. Additionally, as used herein, the term "exemplary" is intended to mean serving as an illustration or example of something, and is not intended to indicate a preference.

As previously mentioned, phased array antennas operate by delaying signal transmission of at least one antenna element with respect to another antenna element in the phased array. However, owing to the antenna elements being in close proximity with respect to each other, mutual coupling can occur. Hence, mutual coupling can occur between two or more antenna elements in an array antenna. Mutual coupling can also occur as a function of the structure (or circuit) from which the array antenna is constructed, and/or supported by.

Further, mutual coupling can also be a function of an operational environment of the array antenna. Thus, a mutual coupling observed in an array antenna operating at a manufacturing facility or in a controlled testing environment can be different to the mutual coupling resulting from environmental and other effects that can be encountered when the array antenna is in actual service and/or operation, e.g., when airborne, shipborne, etc. For example, the operational characteristics of an array antenna and associated feed networks can be determined during testing of a final assembly of the system, e.g., at a manufacturers location. However, during actual operation, the array antenna may be installed and operated in conjunction with a radome and accordingly, an in-situ characterization is to be performed to determine the operational effect(s), if any, of the radome on the mutual coupling of the phased array antenna, as well as any environmental conditions (e.g., cloud, rain, snow, etc.).

FIGS. 1, 2, 3, 4, and 5 illustrate a phased array antenna and feed networks undergoing a plurality of operations to facilitate determination of any mutual coupling effects pertaining to the circuitry and the antenna elements. As further described, the feed networks can be characterized at a manufacturing or testing location, thereby enabling mutual coupling effects to be determined both at the manufacturing and/or testing location, and also while the array antenna is in service operation. Furthermore, a two port (also referred to herein as a two channel) network analyzer can be utilized to determine the mutual coupling of an array antenna comprising a large number of antenna elements.

It is to be appreciated that while the various embodiments and methodologies are directed towards an antenna array, which is a multi-port device, the various embodiments and methodologies are equally applicable to any radio-frequency (RF) multi-port device being measured in conjunction with a 2-port network analyzer.

System 100 illustrated in FIG. 1 comprises a first feed network 110 (marked with a solid line in FIGS. 1-5, also referred to as a first distribution network) and a second feed network 120 (marked with a hashed line in FIGS. 1-5, also referred to as a second distribution network). The first feed network 110 can comprise a plurality of power dividers P1-P3 and the second feed network 120 can comprise a plurality of power dividers P4-P6, whereby the power dividers P1-P6 can be configured to (evenly) divide or combine any power or signal being conveyed across the system 100. The first feed network 110 and the second feed network 120 can have any suitable configuration, such as corporate-fed networks. The first feed network 110 and the second feed network 120 can comprise a single port (e.g., respectively ports 1 and 2) which can be utilized to feed a signal into the respective feed network, as well as feed a signal out of the respective feed network. The first feed network 110 and the second feed network 120 can further include a plurality of feed points, whereby each feed point in a respective feed network can be connected to a switch connection, each switch connection enables the respective feed network to be connected to a plurality of antennas, as further described herein.

Comparing FIG. 1 with FIGS. 2, 3, 4, and 5, it is to be noted that in FIG. 1 no antenna elements (hereinafter referred to as antenna) are connected to the circuit of system 100, the feed networks 110 and 120 terminate at reference planes A, B, C, D, e.g., via respective switch placement and local circuits 121-124. Reference planes A-D can be considered to be connection points at which antenna (e.g., FIG. 2, antennas 210-240) can be connected. Accordingly, as described further, system 100 enables portions of the system 100 to be characterized without any antennas connected. Subsequently, as shown in FIGS. 2, 3, 4, and 5, respective antennas 210, 220, 230, and 240 can be connected to the reference planes A, B, C, and D, to enable mutual coupling effects to be determined between respective pairs of antennas. It is to be noted that while only four reference planes and/or four antennas are presented in FIGS. 1, 2, 3, 4, and 5, as being included in the systems 100 and 200, any number of n antennas can be connected to the first feed network 110 and the second feed network 120, where n is a positive integer greater than one. It is to also to be noted that while only two feed networks are presented in FIGS. 1, 2, 3, 4, and 5, any number of feed networks (such as beam forming networks, etc. . . . ) can be connected to the antennas using switches comprising more throws at each antenna element. For example, the switches can comprise any number, n, of throws, such as being a quadruple antennas, etc.

As shown in FIG. 1, the first feed network 110 connects to each reference plane A-D via a respective switch S1-S4 and a local circuit (e.g., any of local circuits 121-124), and further, the second feed network 120 also connects to each reference plane A-D via a respective switch S1-S4 and a local circuit. For example, the first feed network 110 can connect to reference plane A via a switch S1 switching to connector 1A, the first feed network 110 can connect to reference plane B via a switch S2 switching to connector 1B, the first feed network 110 can connect to reference plane C via a switch S3 switching to connector 1C, and the first feed network 110 can connect to reference plane D via a switch S4 switching to connector 1D. Further, the second feed network 120 can connect to reference plane A via the switch S1 switching to connector 2A, the second feed network 120 can connect to reference plane B via the switch S2 switching to connector 2B, the second feed network 120 can connect to reference plane C via the switch S3 switching to connector 2C, and the second feed network 120 can connect to reference plane D via the switch S4 switching to connector 2D. For each reference plane (and also antennas 210-240), connection to the first feed network is via respective switches S1-S4 being in a first switch position, and for connection to the second feed network is via respective switches S1-S4 being in a second switch position. In an embodiment, any of switches S1-S4 can be configured such that any unconnected ports of a switch (e.g., any of switches S1-S4) self-terminate to a known impedance, e.g., any of switches S1-S4 can be resistive switches.

As further shown in FIG. 1, each of the respective reference planes A, B, C, and D can also be switched to ground via an impedance termination, switches S1-S4 can be in a third switch position to enable the respective reference plane (and also antennas 210-240) to be terminated by an impedance to ground. For example, reference plane A can terminate to ground via the switch S1 switching to connector 3A, reference plane B can terminate to ground via the switch S2 switching to connector 3B, reference plane C can terminate to ground via the switch S3 switching to connector 3C, and reference plane D can terminate to ground via the switch S4 switching to connector 3D. The ground termination value can be of any suitable magnitude, whereby the magnitude can be based upon circuitry forming a network analyzer utilized to perform various measurements described herein. For example, the various embodiments presented herein utilize a ground termination having a magnitude of $50\Omega$.

In an embodiment, the system 100 can be manufactured as a multi-layer circuit, whereby the first feed network 110 can be formed as a first layer, and the second feed network 120 can be formed as a second layer. In another embodiment, the first feed network 110 and the second feed network 120 can be combined as a single layer. The switches 1A-1D, 2A-2D, and 3A-3D can be incorporated into a switch matrix layer 130. Further, the switches S1-S4 can be triple (or more) throw switches.

A network analyzer (e.g., a performance network analyzer (PNA), a vector network analyzer (VNA), etc.) can be connected at different positions on system 100 to enable the respective mutual coupling effects to be measured, along with any circuit effects or properties, wherein the network analyzer can have undergone calibration. For example, a 2-port network analyzer can be utilized, with a first channel of the network analyzer connected to port 1 of the first feed network 110, and a second channel of the network analyzer connected to port 2 of the second feed network 120, thereby enabling in-situ characterization of the multi-port mutual coupling.

In an aspect, it is desired to know the effect of the feed network on any mutual coupling which may occur between a pair of antennas, whereby the feed network can be considered to comprise first circuitry which includes the first feed network 110, the various switches S1-S4 (and switch connections 1A-1D), and further any initial circuits 121-124 respectively connecting port 1 to any of reference planes A-D, and to further comprise a second circuitry which includes the second feed network 120, the various switches S1-S4 (and switch connections 2A-2D), and further any initial circuits 121-124 respectively connecting port 2 to any of reference planes A-D. By knowing the mutual coupling effects generated by the first circuitry and the second circuitry, when a subsequent measurement is made between, for example port 1 and an antenna 210 located at the reference plane A, and port 2 and an antenna 220 located at the reference plane B, it is possible to adjust the mutual coupling measurement to account for the electrical effects engendered by the first circuitry and/or the second circuitry. Such electrical effects can include loss and imperfections at any of the power dividers P1-P6, the feed networks 110 and 120, and radio frequency effects.

With reference to FIG. 1, it is possible to measure scattering parameters, or $S_{11}$ and/or $S_{22}$, at reference planes A, B, C, and D. The first measurements are conducted without any antennas connected to the system 100, and the switches S1-S4 are switched to a position (e.g., the third switch position 3A, 3B, 3C, and 3D) such that the reference planes A, B, C, and D are connected to ground via the respective local circuits 121-124. As previously mentioned, a termination resistance (e.g., 50Ω) can be applied at the reference planes A, B, C, and D.

Accordingly, the first or second channel of a network analyzer can be connected individually to the reference planes A, B, C, and D, while S1, S2, S3, and S4 are switched to their termination impedance of 50Ω via paths 3A, 3B, 3C, and 3D, respectively. Hence, in an initial measurement A, a channel of the network analyzer is connected to reference plane A. Next, for measurement B, a channel of the network analyzer is connected to reference plane B. Subsequently, for measurement C, a channel of the network analyzer is connected to reference plane C. Further, for measurement D, a channel of the network analyzer is connected to reference plane D. Based upon the measurements it is possible to determine $Z_A$, $Z_B$, $Z_C$, $Z_D$ from $\Gamma_A$, $\Gamma_B$, $\Gamma_C$, $\Gamma_D$, $$\Gamma_A \quad \Gamma_B \quad \Gamma_C \quad \Gamma_D$$
$$\downarrow \quad \downarrow \quad \downarrow \quad \downarrow$$
$$Z_A \quad Z_B \quad Z_C \quad Z_D$$

where $\Gamma$ is a voltage reflection coefficient or $S_{11}$ at each reference plane A-D, and Z is a port impedance for each port, whereby in the presented example $\mathcal{Z}_A$, $\mathcal{Z}_B$, $\mathcal{Z}_C$, and $\mathcal{Z}_D$ are the respective impedance with the network analyzer set to 50Ω termination.

Table 1, below, presents the various connections that can be undertaken to enable determination of any mutual coupling effects between the antennas 210, 220, 230, and 240. The first four measurements, A-D, in the Table 1 indicate the positions of the first channel and the second channel of the network analyzer to determine the characteristics of the local termination circuits, as previously described. Measurements 1-12 indicate the positions of the first channel and the second channel of the network analyzer to determine the respective mutual coupling effects $S^{\#1}$-$S^{\#6}$. It is to be noted that as certain measurements are undertaken, they do not have to be repeated. For example, once αA has been determined (in the first measurement) to enable determination of $S^{\#1}$, the αA measurement can be utilized to determine $S^{\#2}$ and $S^{\#3}$. α(*) and β(*), in Table 1, indicate the total circuit being measured, where * is respectively A, B, C or D.

TABLE 1

Port connections and values obtained.

| Meas. | First Ch. of NA | Second Ch. of NA | Obtain |
|---|---|---|---|
| A | S1 | | $Z_A$ |
| B | | S2 | $Z_B$ |
| C | S3 | | $Z_C$ |
| D | | S4 | $Z_D$ |
| 1 | α | A | αA |
| 2 | β | B | βB |
| 3 | α(A) | β(B) | AB = $S^{\#1}$ |
| 4 | β | C | βC |
| 5 | α(A) | β(C) | AC = $S^{\#2}$ |
| 6 | β | D | βD |
| 7 | α(A) | β(D) | AD = $S^{\#3}$ |
| 8 | α | B | αB |
| 9 | β | C | βC |
| 10 | α(B) | β(C) | BC = $S^{\#4}$ |
| 11 | β | D | βD |
| 12 | α(B) | β(D) | BC = $S^{\#5}$ |
| 13 | α | C | αC |
| 14 | α(C) | β(D) | CD = $S^{\#6}$ |

Figure 2:
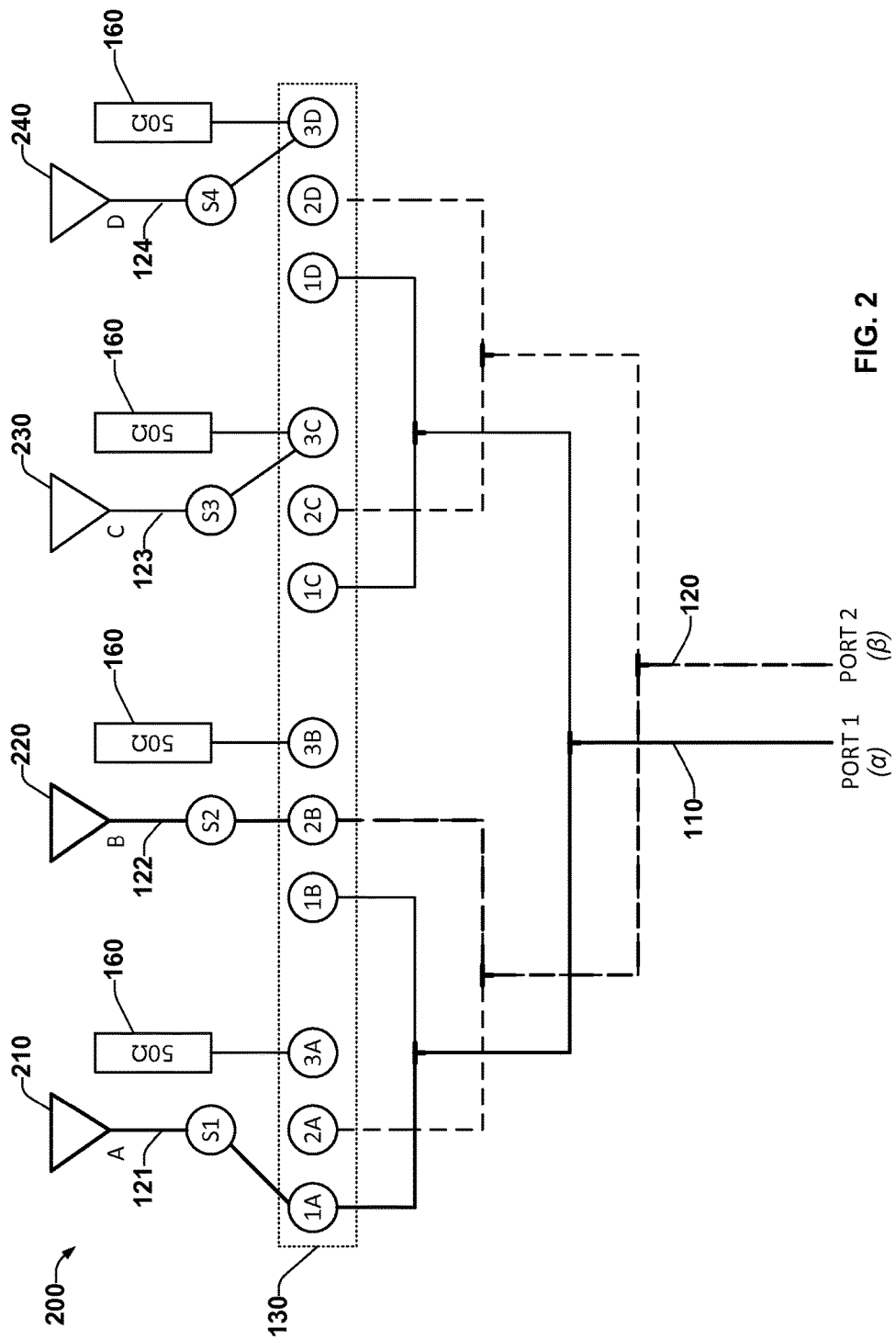
FIG. 2 illustrates the exemplary system for characterizing mutual coupling between pairs of antenna elements in a second configuration.

Turning to FIG. 2, a system 200 is illustrated, whereby, in comparison with system 100, antennas 210-240 have been attached to the respective reference planes A-D. Further, switch S1 has been switched to connection 1A to create a first circuit between port 1 (as indicated by the continuous heavy line), via the first feed network 110, the first initial circuit 121, and the antenna 210. Further, switch S2 has been switched to connection 2B to create a second circuit between port 2 (as indicated by the heavy broken dashed line), via the second feed network 120, the second initial circuit 122 and the antenna 220.

With the configuration shown in FIG. 2, three different measurements can be conducted. For a first measurement, a first channel of a network analyzer can be attached to port 1, and a second channel of the network analyzer can be attached to the reference plane A. Hence, with such a switched arrangement, it is possible to measure a full 2-port S-parameter of path αA [$S^{\alpha A}$], e.g., between port 1 and antenna 210.

For a second measurement, the first channel of the network analyzer can be subsequently be attached to port 2, and the second channel of the network analyzer can be attached to the reference plane B. Hence, with such a switched arrangement, it is possible to measure a full 2-port S-parameter of path βB [$S^{\beta B}$], e.g., between port 2 and antenna 220.

For a third measurement, the first channel of the network analyzer can be connected to port 1 and the second channel of the network analyzer can be connected to port 2, thereby enabling a measure between α and β. Accordingly, by transmitting a first signal along the first feed network 110 to the antenna 210, it is possible to measure a first portion of the first signal received at the antenna 220, via the second feed network 120, with the second channel of the network analyzer attached to port 2. The magnitude and phase of the first portion of the first signal received at the antenna 220 is a function of a mutual coupling between the first antenna 210 and antenna 220.

Figure 2A:
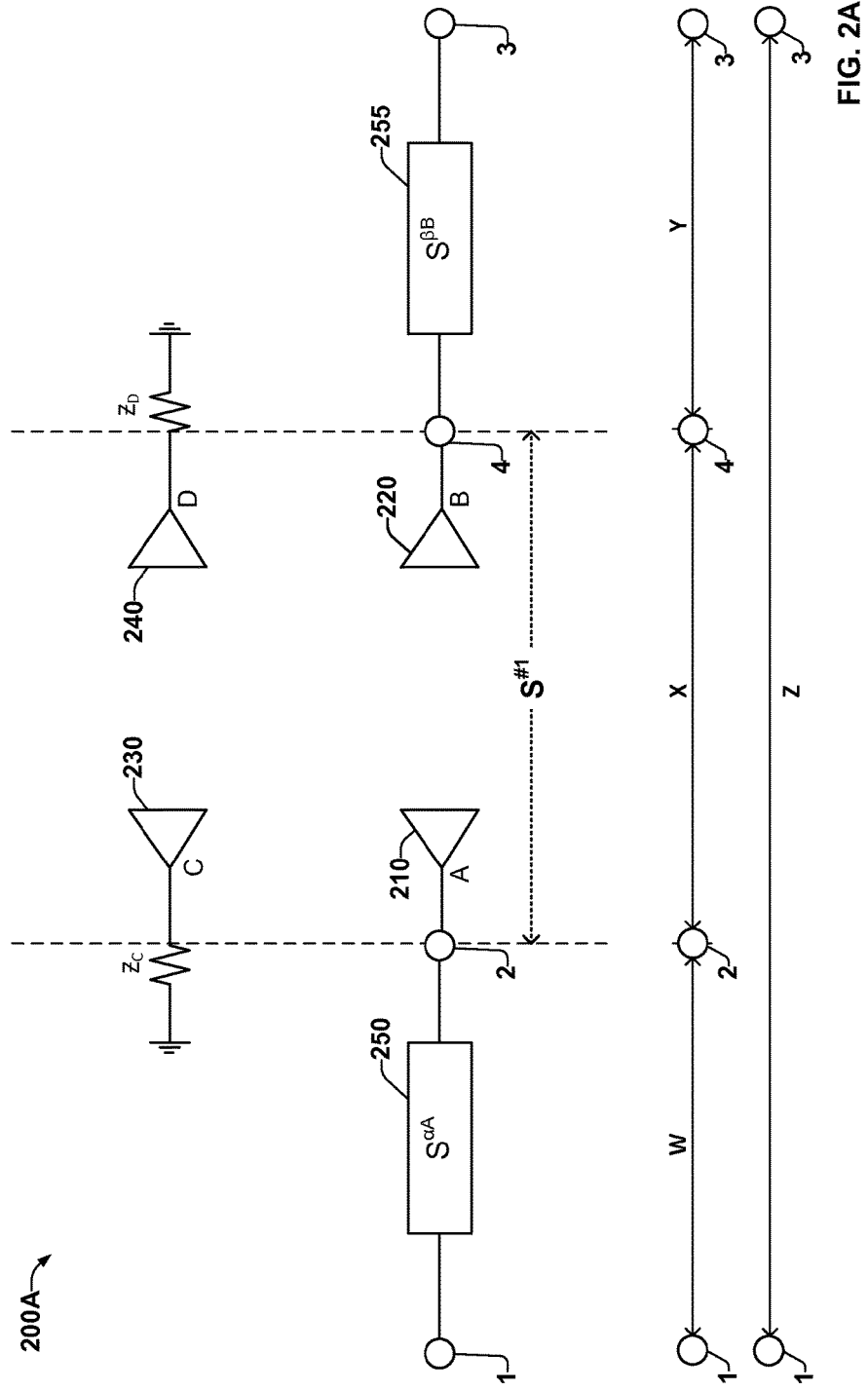
FIG. 2A presents a schematic of measurement of mutual coupling between a first pair of antenna elements.

Turning to FIG. 2A, a schematic 200A is presented, which illustrates the respective paths and measurements which are being measured in FIG. 2. Position 1 of schematic 200A corresponds to port 1 (α) of system 200, position 2 of schematic 200A corresponds to reference plane A of system 200, while position 3 of schematic 200A corresponds to port 2 (β) of system 200, and position 4 of schematic 200A corresponds to reference plane B of system 200. As shown in FIGS. 2 and 2A, reference plane C is terminated to ground, $\mathcal{Z}_C$, and reference plane D is terminated to ground, $\mathcal{Z}_D$.

Accordingly, the first measurement is made between position 1 and position 2, the second measurement is made between positions 3 and 4, and the third measurement is made between positions 1 and 3.

It is desired to know, from the three measurements, what is the magnitude and phase of $S^{\#1}$?, (e.g., between position 2 and position 4). The foregoing can be expressed algebraically, as shown at the bottom of FIG. 2A, with W being the first measurement between position 1 and position 2, Y being the second measurement between position 3 and 4, Z is the third measurement made between position 1 and 3, and X is the unknown $S^{\#1}$ between position 2 and 4.

A 12-term error coefficient with leakage terms set to "0" can be utilized to obtain $S^{\#1}$. The 12-term error coefficient can be a standard algorithm incorporated into the network analyzer. A suitable 12-term error coefficient, and implementation process relating thereto, is described in "Applying Error Correction to Network Analyzer Measurements", Agilent Application Note AN-1287-3, FIG. 5, which is incorporated herein by reference in its entirety. As shown, the measure [$S^{\alpha A}$] equates to an error box 250, as measured between position 1 (e.g., port 1) and position 2 (e.g., reference plane A). Further, the measure [$S^{\beta B}$] equates to an error box 255, as measured between position 3 (e.g., port 2) and position 4 (e.g., reference plane B). With knowledge of the error box 250 and the error box 255 it is possible to de-embed the values for [$S^{\alpha A}$] and [$S^{\beta B}$], from the third measurement between α and β (e.g., measured across position 1 and position 3). De-embedding [$S^{\alpha A}$] and [$S^{\beta B}$] from the third measurement enables $S^{\#1}$ to be determined. Hence, it is possible to identify a mutual coupling between antennas 210 and 220, even though the measurement between positions 2 and 4 was not actually conducted.

It is further possible to renormalize the corrected $S^{\#1}$ from $$\begin{bmatrix} 50 \\ 50 \end{bmatrix} \rightarrow \begin{bmatrix} Z_A \\ Z_B \end{bmatrix}$$

system, using an impedance renormalization algorithm, where 50 represents the 50Ω operational setting applied to the network analyzer. Accordingly, $S^{\#1}$ is renormalized to take into account the impedance effect of $Z_A$ and $Z_B$, e.g., the respective impedances of switch S1 and initial circuit 121, and switch S2 and initial circuit 122, as determined with reference to FIG. 1. A process, such as the above, is described in Tippet, et al., "A Rigorous Technique for Measuring the Scattering Matrix of a Multiport Device with a 2-Port Network Analyzer", IEEE Transactions on Microwave Theory and Techniques, Vol. MTT-30, No. 5, May 1982, which is incorporated herein by reference in its entirety.

Figure 3:
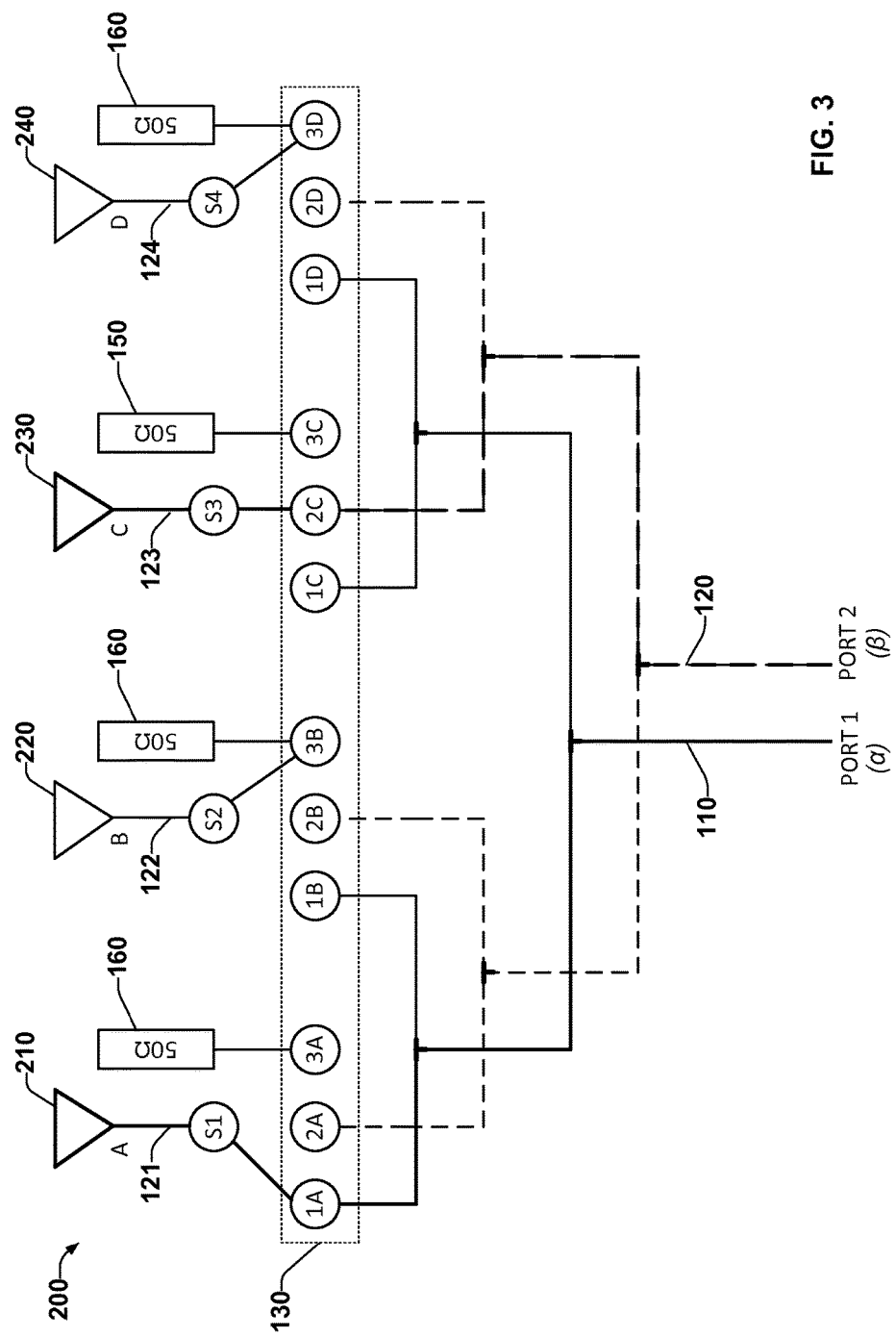
FIG. 3 illustrates the exemplary system for characterizing mutual coupling between pairs of antenna elements in a third configuration.

Turning to FIG. 3, the configuration of system 200 has been adjusted such that, in comparison with FIG. 2, switch S3 is switched to connector 2C, such that antenna 230, and reference plane C, is now connected to port 2 (β) via the second feed network 120 and initial circuit 123. Switch S1 remains switched to connection 1A to maintain the first circuit between port 1, via the first feed network 110, initial circuit 121, and the antenna 210. Reference plane B is terminated to ground (per switch S2 being switched to connection 3B) and reference plane D remains terminated to ground (per switch S4 being switched to connection 3D). Accordingly, reference plane B has a measure of 4, and reference plane D has a measure of $Z_D$.

With the configuration shown in FIG. 3, two further measurements can be conducted, [$S^{\alpha A}$] is already known from the first measurement conducted with reference to FIGS. 2 and 2A.

For a fourth measurement, the first channel of the network analyzer can be subsequently be attached to port 2, and the second channel of the network analyzer can be attached to the reference plane C. Hence, with such a switched arrangement, it is possible to measure a full 2-port S-parameter of path βC [$S^{\beta C}$], e.g., between port 2 and antenna 230.

For a fifth measurement, the first channel of the network analyzer can be connected to port 1, and the second channel of the network analyzer can be connected to port 2, thereby enabling a measure between α and β. Accordingly, by transmitting a second signal along the first feed network 110 to the antenna 210, it is possible to measure a second portion of the second signal received at the antenna 230, via the second feed network 120, with the second channel of the network analyzer attached to port 2. A magnitude and phase of the second portion of the second signal received at the antenna 230 is a function of a mutual coupling between the antenna 210 and antenna 230.

Figure 3A:
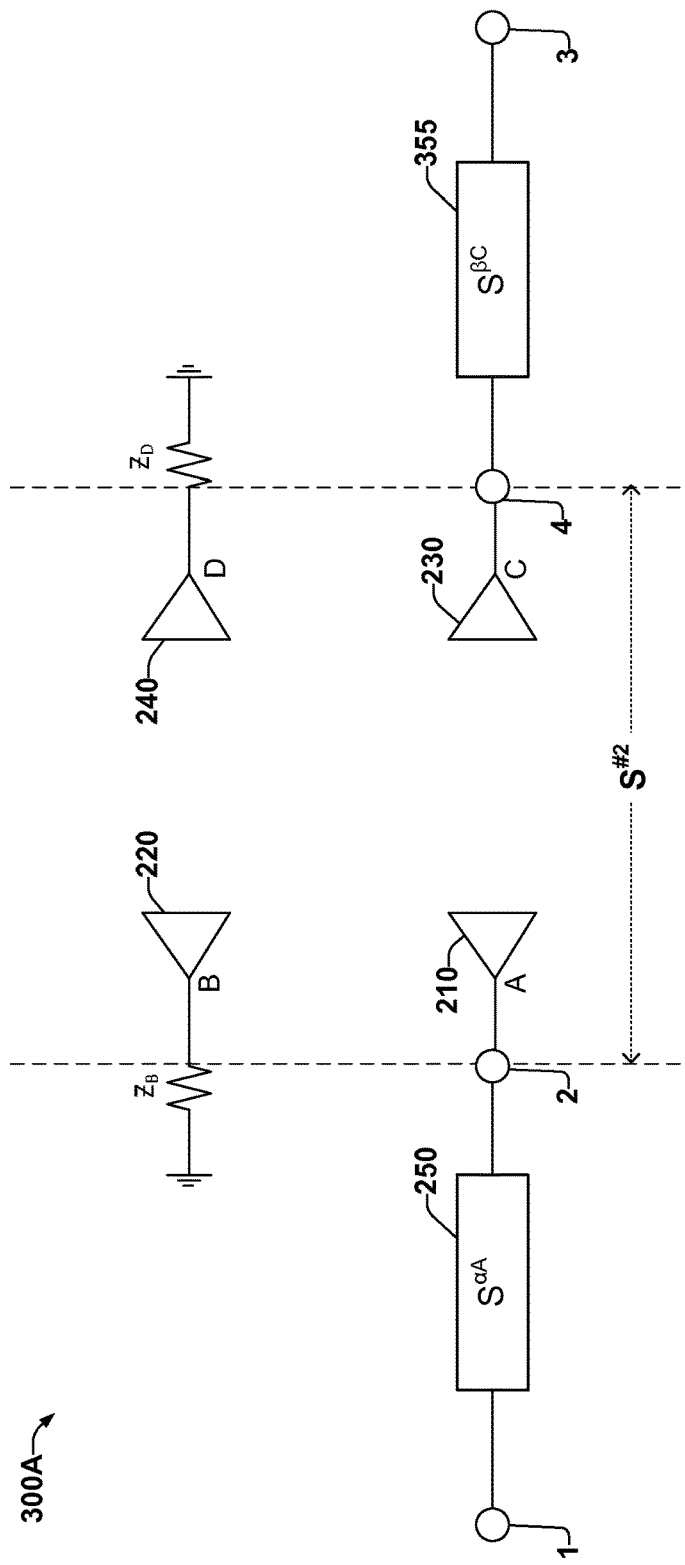
FIG. 3A presents a schematic of measurement of mutual coupling between a second pair of antenna elements.

Turning to FIG. 3A, a schematic 300A is presented, which illustrates the respective paths and measurements which are being measured in FIG. 3. Position 1 of schematic 300A corresponds to port 1 (α) of system 300, position 2 of schematic 300A corresponds to reference plane A of system 300, while position 3 of schematic 300A corresponds to port 2 (β) of system 300, and position 4 of schematic 300A corresponds to reference plane C of system 300. As shown in FIGS. 3 and 3A, reference plane B is terminated to ground, $Z_B$, and reference plane D is terminated to ground, $Z_D$.

Accordingly, the fourth measurement is made between positions 3 and 4, and the fifth measurement is made between positions 1 and 3.

Per FIGS. 3 and 3A, it is desired to know, from the first measurement, and also the fourth and fifth measurements, what is the magnitude and phase of $S^{\#2}$?, (e.g., between position 2 and position 4). The 12-term error coefficient with leakage terms set to 0 is to be utilized to obtain $S^{\#2}$. As shown, the measure [$S^{\alpha A}$] equates to an error box 250, as measured between position 1 (e.g., port 1) and position 2 (e.g., reference plane A). Further, the measure [$S^{\beta C}$] equates to an error box 355, as measured between position 3 (e.g., port 2) and position 4 (e.g., reference plane C). With knowledge of the error box 250 and the error box 355 it is possible to de-embed the values for [$S^{\alpha A}$] and [$S^{\beta C}$], from the fifth measurement between α and β (e.g., measured across position 1 and position 3). De-embedding [$S^{\alpha A}$] and [$S^{\beta C}$] from the fifth measurement enables $S^{\#2}$ to be determined. Hence, it is possible to identify a mutual coupling between antennas 210 and 230, even though the measurement between positions 2 and 4 was not actually conducted It is further possible to renormalize the corrected $S^{\#2}$ from $$\begin{bmatrix} 50 \\ 50 \end{bmatrix} \rightarrow \begin{bmatrix} Z_A \\ Z_C \end{bmatrix}$$

system, using an impedance renormalization algorithm, where 50 represents the 50Ω operational setting applied to the network analyzer. Accordingly, $S^{\#2}$ is renormalized to take into account the impedance effect of $Z_A$ and $Z_C$, e.g., the respective impedance of switch S1 and initial circuit 121, and switch S3 and initial circuit 123.

Figure 4:
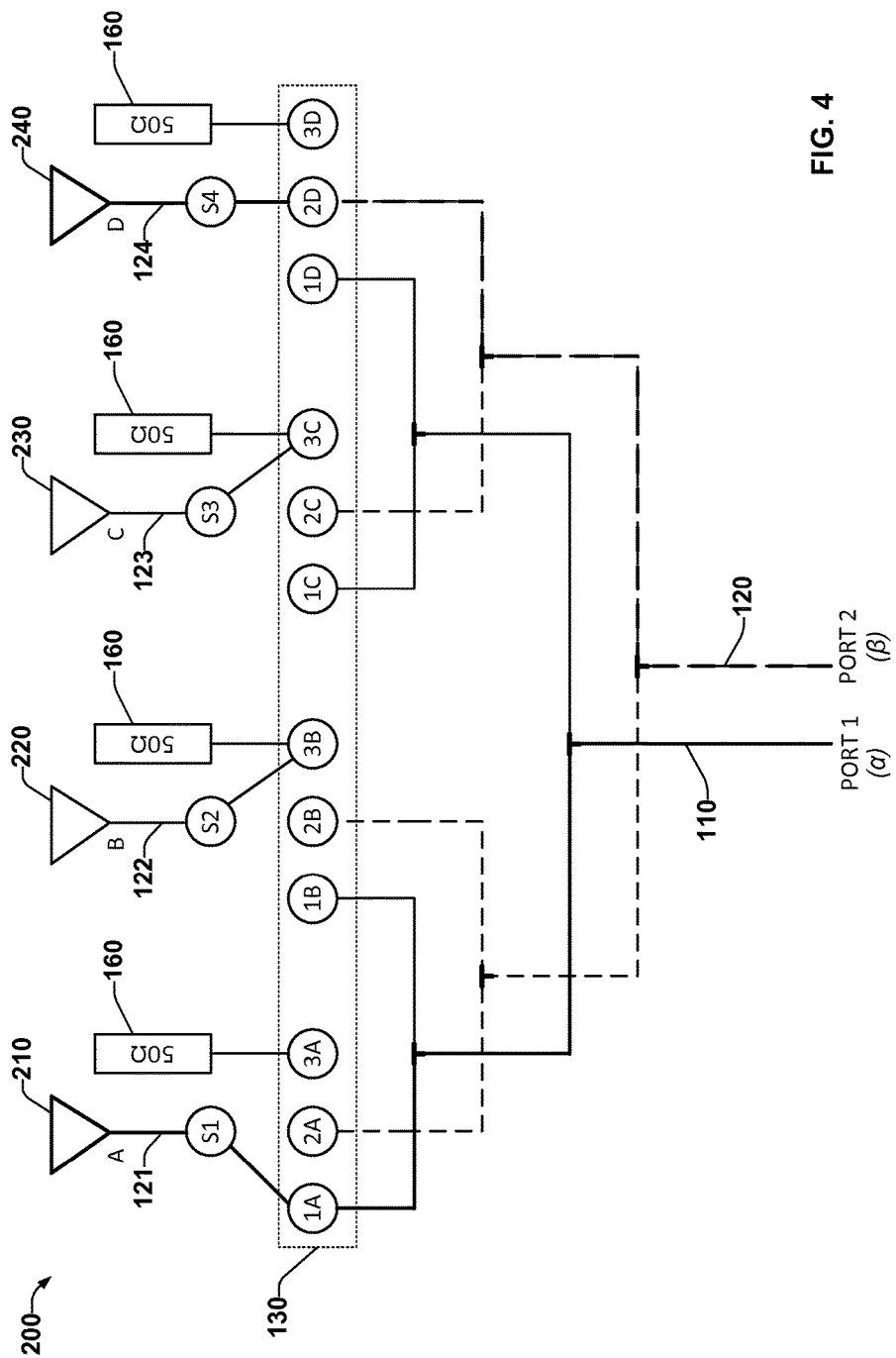
FIG. 4 illustrates the exemplary system for characterizing mutual coupling between pairs of antenna elements in a fourth configuration.

Turning to FIG. 4, the configuration of system 200 has been adjusted such that, in comparison with FIG. 3, switch S4 is switched to connector 2D, such that antenna 240, and reference plane D, is now connected to port 2 (β) via the second feed network 120. Switch S1 remains switched to connection 1A to maintain the first circuit between port 1, via the first feed network 110, and the antenna 210. Reference plane B is terminated to ground (per switch S2 being switched to connection 3B) and reference plane C is terminated to ground (per switch S3 being switched to connection 3C). Accordingly, reference plane B has a measure of $Z_B$, and reference plane C has a measure $Z_C$.

With the configuration shown in FIG. 4, two further measurements can be conducted. [$S^{\alpha A}$] is already known from the first measurement conducted with reference to FIGS. 2 and 2A.

For a sixth measurement, the first channel of the network analyzer can be attached to port 2, and the second channel of the network analyzer can be attached to the reference plane D. Hence, with such a switched arrangement, it is possible to measure a full 2-port S-parameter of path βD [$S^{\beta D}$], e.g., between port 2 and antenna 240.

For a seventh measurement, the first channel of the network analyzer can be connected to port 1 and the second channel of the network analyzer can be connected to port 2, thereby enabling a measure between α and β. Accordingly, by transmitting a third signal along the first feed network 110 to the antenna 210, it is possible to measure a third portion of the third signal received at the antenna 240, via the second feed network 120, with the second channel of the network analyzer attached to port 2. A magnitude and phase of the third portion of the third signal received at the antenna 240 is a function of a mutual coupling between the antenna 210 and antenna 240.

Figure 4A:
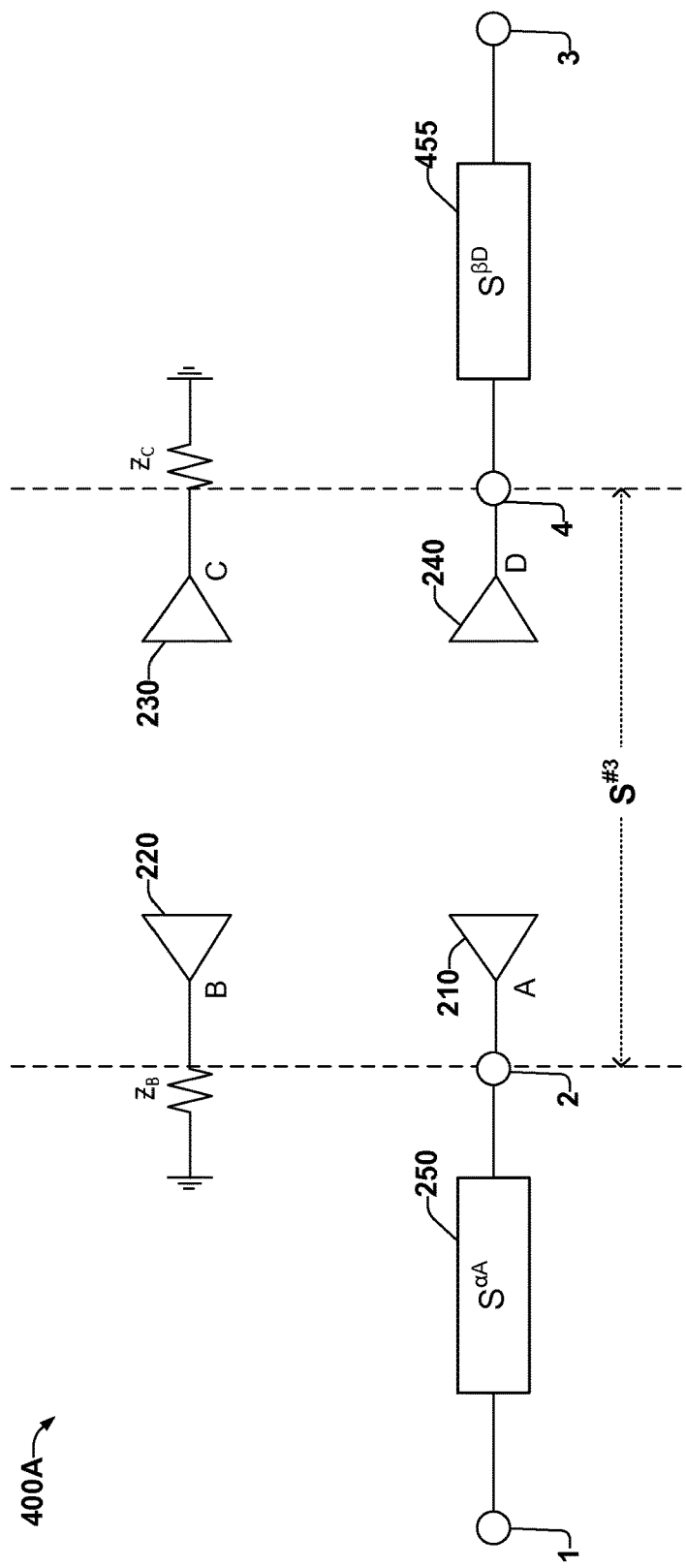
FIG. 4A presents a schematic of measurement of mutual coupling between a third pair of antenna elements.

Turning to FIG. 4A, a schematic 400A is presented, which illustrates the respective paths and measurements which are being measured in FIG. 4. Position 1 of schematic 400A corresponds to port 1 (α) of system 200, position 2 of schematic 400A corresponds to reference plane A of system 200, while position 3 of schematic 400A corresponds to port 2 (β) of system 200, and position 4 of schematic 400A corresponds to reference plane D of system 200. As shown in FIGS. 4 and 4A, reference plane B is terminated to ground, $Z_B$, and reference plane C is terminated to ground, $Z_C$.

Accordingly, the sixth measurement is made between positions 3 and 4, and the seventh measurement is made between positions 1 and 3.

Per FIGS. 4 and 4A, it is desired to know, from the first measurement, and also the sixth and seventh measurements, what is a magnitude and phase of $S^{\#3}$?, (e.g., between position 2 and position 4). The 12-term error coefficient with leakage terms set to "0" is to be utilized to obtain $S^{\#3}$. As shown, the measure [$S^{\alpha A}$] equates to an error box 250, as measured between position 1 (e.g., port 1) and position 2 (e.g., reference plane A). Further, the measure [$S^{\beta D}$] equates to an error box 455, as measured between position 3 (e.g., port 2) and position 4 (e.g., reference plane D). With knowledge of the error box 250 and the error box 455 it is possible to de-embed the values for [$S^{\alpha A}$] and [$S^{\beta D}$], from the seventh measurement between α and β (e.g., measured across position 1 and position 3). By de-embedding [$S^{\alpha A}$] and [$S^{\beta D}$] from the seventh measurement enables $S^{\#3}$ to be determined. Hence, it is possible to identify a mutual coupling between antennas 210 and 230, even though the measurement between positions 2 and 4 was not actually conducted It is further possible to renormalize the corrected $S^{\#3}$ from $$\begin{bmatrix} 50 \\ 50 \end{bmatrix} \rightarrow \begin{bmatrix} Z_A \\ Z_D \end{bmatrix}$$

system, using a renormalization algorithm, where 50 represents the 50Ω operational setting applied to the network analyzer. Accordingly, $S^{\#3}$ is renormalized to take into account the impedance effect of $Z_A$ and $Z_D$, e.g., the respective impedance of switch S1 and initial circuit 121, and switch S4 and initial circuit 124.

Figure 5:
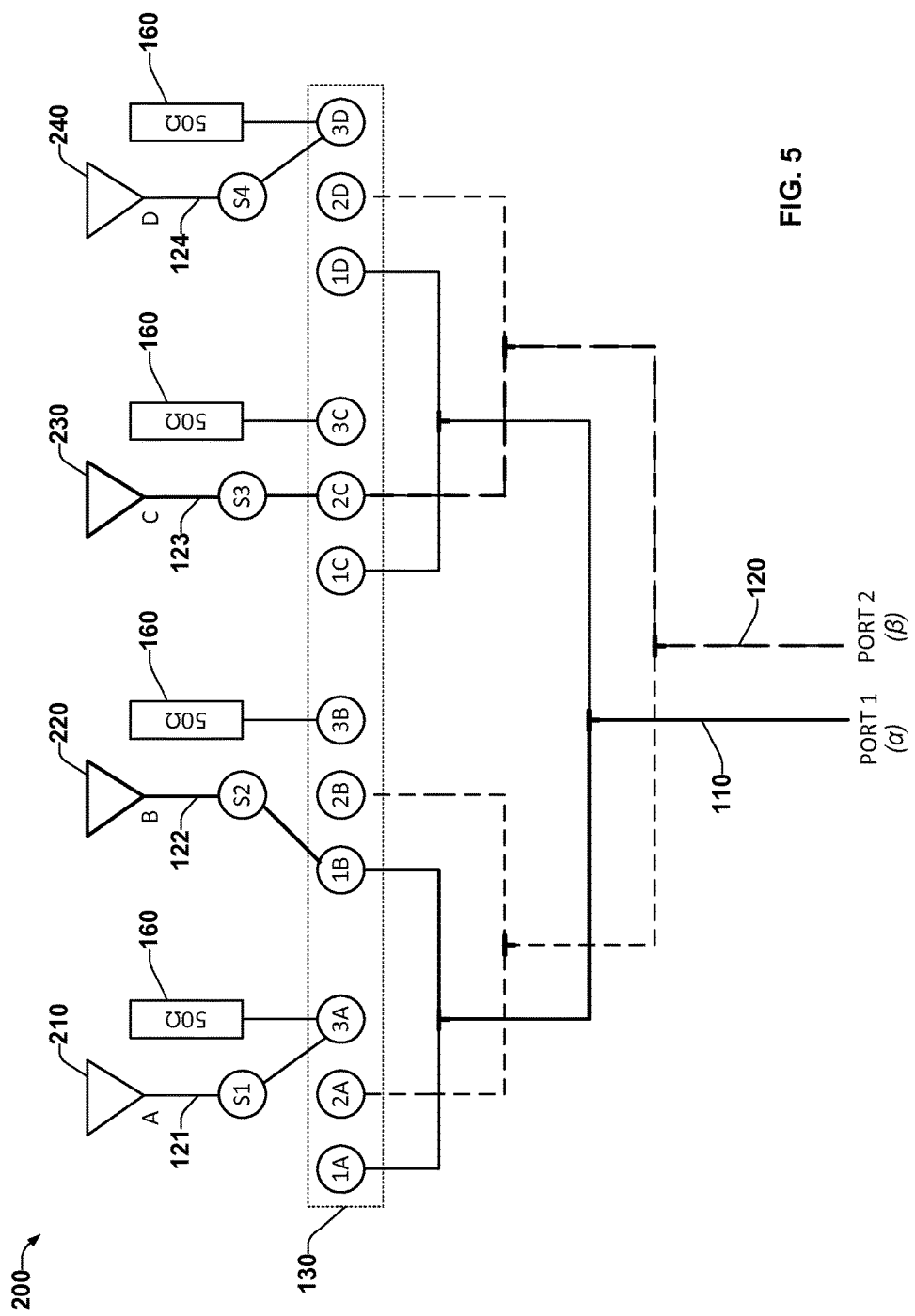
FIG. 5 illustrates the exemplary system for characterizing mutual coupling between pairs of antenna elements in a fifth configuration.

The procedure described above to facilitate determining αA, βB, βC, and βD can be repeated to facilitate determination of αB and αC, as detailed in Table 1, above, to determine the mutual coupling that respectively exists between antennas B (220), C (230), and D (240). To facilitate determining αB, as shown in FIG. 5, system 200 can be configured such that switch S2 is switched to connector 1B, thereby port 1(α) is connected to the reference plane B and antenna 220, via the first feed network 110 and the initial circuit 122. The second feed network 120 can be connected, respectively, to the antenna 230 (e.g., via switch S3 being switched to connector 2C), and then to antenna 240 (e.g., via switch S4 switched to connector 2D).

As shown in FIG. 5A in conjunction with Table 1, measurements 8, 9, and 10 can be conducted to enable determination of $S^{\#4}$, which is the mutual coupling between antennas 220 and 230.

The mutual coupling between antennas 220 and 240, e.g., $S^{\#5}$, can be determined per measurements 11 and 12 presented in Table 1, in conjunction with the configuration illustrated in FIG. 6.

Finally, the mutual coupling between antennas 230 and 240, e.g., $S^{\#6}$, can be determined per measurements 13 and 14 presented in Table 1, in conjunction with the configuration illustrated in FIG. 7.

From the six determinations, $S^{\#1}$-$S^{\#6}$ it is possible to assemble a full 4-port S-parameter m×n matrix, where m and n are positive integers greater than zero. In the exemplary embodiment presented herein, m=4 and n=4:

$$\begin{bmatrix} S_{11} & \cdots & S_{1n} \\ \vdots & \ddots & \vdots \\ S_{m1} & \cdots & S_{mn} \end{bmatrix} = \begin{bmatrix} S_{11} & S_{12} & S_{13} & S_{14} \\ S_{21} & S_{22} & S_{23} & S_{24} \\ S_{31} & S_{32} & S_{33} & S_{34} \\ S_{41} & S_{42} & S_{43} & S_{44} \end{bmatrix}$$

The full 4-port S-parameter m×n matrix can then be impedance renormalized from $$\begin{bmatrix} Z_A \\ Z_B \\ Z_C \\ Z_D \end{bmatrix}$$

back to $$\begin{bmatrix} 50 \\ 50 \\ 50 \\ 50 \end{bmatrix},$$

where 50 represents the 50Ω operational settings applied to the network analyzer.

Per the foregoing, a multi-port S parameter array can be generated from a plurality of 2-port measurements (e.g., utilizing a 2-port network analyzer), whereby the measurements are all in accord with an impedance system, as determined with regard to the operations relating to FIG. 1.

Figure 8:
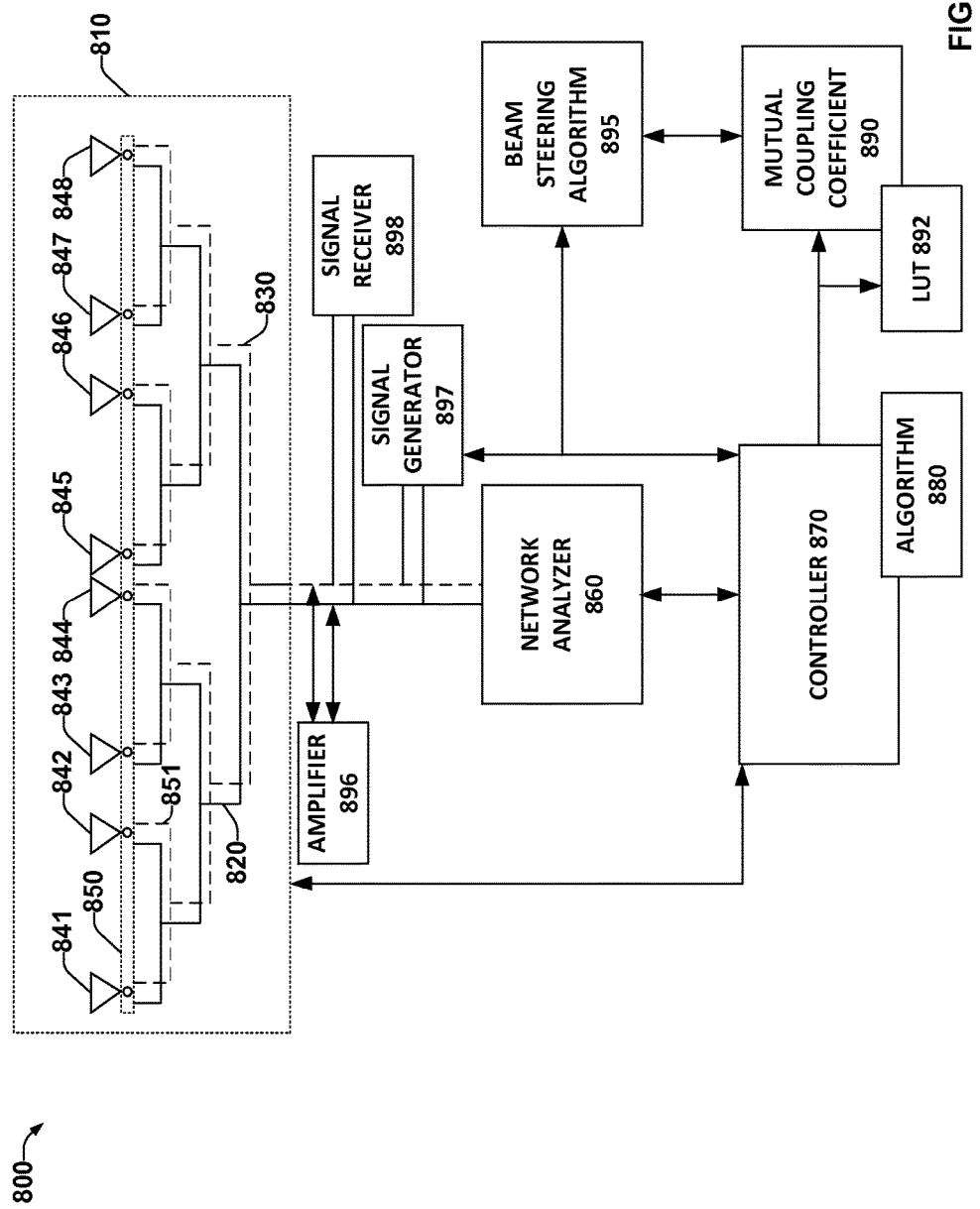
FIG. 8 illustrates a system for characterizing mutual coupling between pairs of antenna elements.

FIG. 8 illustrates a system 800 for determining mutual coupling between a plurality of antennas in an array antenna. The system 800 comprises a phased array antenna 810, which as previously described, includes a first feed network 820 (comparable to feed network 110) and a second feed network 830 (comparable to feed network 120). The first feed network 820 and the second feed network 830 are respectively coupled to a plurality of antennas 841-848, whereby the first feed network 820 and the second feed network 830 can be coupled to the plurality of antennas 841-848 via a network of switches 850 and a plurality of initial circuits (a single initial circuit 851 is marked). The plurality of antennas 841-848 can operate comparable to the operation of antennas 210-240, the network of switches 850 can operate comparable to the operation of switches S1-S4, and further, the plurality of initial circuits (e.g., including initial circuit 851) can operate comparable to the operation of initial circuits 121-124.

The system 800 further comprises a network analyzer 860. As previously described, the network analyzer 860 can be a 2-port network analyzer, wherein a first port (or first channel) of the network analyzer 860 can be connected to the first feed network 820 and a second port (or second channel) of the network analyzer 860 can be connected to the second feed network 830, as well as any reference planes, as previously described.

A controller 870 is further included in system 800, whereby the controller 870 can control operation of the phased array antenna 810, and the various components included therein. For example, the controller 870 can control operation of the respective switches S1-S4 across the network connections (e.g., respectively between the first switch position, second switch position, and third switch position, as previously described). As the controller 870 is controlling operation of the switches included in the network of switches 850, the controller 870 can also be controlling measurements being recorded at the network analyzer 860, for each respective switch position for each antenna pairing, as previously described.

The controller 870 can include an algorithm 880 which can be utilized by the controller 870 to control the respective switch positions to enable the various measurements to be conducted for each antenna pairing. The algorithm 880 can also include instructions on which measurements are to be conducted, and which measurements can be omitted for an antenna pairing owing to values for that particular measurement has already been obtained from another antenna pairing operation. As previously described, the algorithm 880 can generate instructions regarding determination of $Z_A$, $Z_B$, $Z_C$, and $Z_D$ for a given termination, as previously described. Further, the algorithm 880 can further apply an impedance renormalization algorithm to renormalize the respective S parameters (e.g., $S^{\#1}$-$S^{\#6}$) in accordance with any determined voltage reflection coefficient(s) F and port impedances Z.

The controller 870 can generate a mutual coupling coefficient(s) 890 for each antenna pair in the phased array antenna 810. Accordingly, the mutual coupling coefficient(s) 890 can be initially generated at a manufacturer or testing facility, and can subsequently be utilized in-situ when the phased array antenna 810 is operated in service. The in-situ operation of the mutual coupling coefficient(s) 890 enables operation of the phased array antenna 810 to be conducted in accordance with any environmental conditions encountered during steering of a radar beam from the phased array antenna 810, while mitigating any electrical effects engendered by circuits and switches comprising any of the first feed network 820, the second feed network 830, the network of switches 850, the plurality of initial circuits, etc.

The mutual coupling coefficient(s) 890 can be stored in a look up table (LUT) 892, whereby the controller 870 can access the LUT 892. As well as the mutual coupling coefficient(s) 890 being stored in the LUT 892, the LUT 892 can also store any electrical characteristics determined for the first feed network 820, the second feed network 830, switches in the network of switches 850, and the plurality of initial circuits, as previously described. Accordingly, the mutual coupling coefficient(s) 890 and other information (e.g., the electrical characteristics) which is generated at the manufacturer or testing facility, is available to the controller 870 for any in-situ analysis when phased array antenna 810 is operated in service.

During in-situ operation, it is possible that the network analyzer 860 is not included in the system 800. Accordingly, the controller 870 can be utilized to control operation of the phased array antenna 810. In an embodiment, the controller 870 can utilize a beam steering algorithm 895 to facilitate phased operation of the phased array antenna 810, whereby the controller 870 can supplement configurations defined in the beam steering algorithm 895 with the mutual coupling coefficient(s) 890. For example, the controller 870 can be configured to control the amplitude (attenuator) and phase (phase-shifter and/or true-time-delay device) at each antenna element of a signal over the first feed network or a dedicated beam weighting and steering feed network all together, e.g., the controller 870, in accordance with a signal generator 897, can control signal generation such that a first signal at a first antenna element is driven differently to how a second signal at a second antenna element is driven. For example, the first signal is imparted a different phase to that of the second signal. Based upon the various mutual couplings between respective antenna elements, a respective signal driving each antenna element can be adjusted (e.g., by the controller 870 in conjunction with a signal generator 897, attenuators, variable-gain stages and phase-shifters at each element) to compensate for the various mutual couplings, thereby enabling a defined radiation pattern to be achieved. As mentioned, information stored in the LUT 892 can be utilized by the controller 870 to facilitate adjustment of values comprising the beam steering algorithm 895 to compensate for any mutual coupling effects. As further shown in FIG. 8, the system 800 can further include a signal receiver 898, wherein the signal receiver 898 can be utilized to enable reception of one or more signals at the first feed network 820 and/or the second feed network 830.

As the respective size of the first feed network 820 and the second feed network 830 increase (e.g., from the n=4, n=8, n=1000 antenna elements described herein) signal loss can occur, e.g., as a function of a signal being split, and further transmission losses occurring the through various circuits comprising the phased array antenna 810. System 800 can further include an amplifier(s) 896 which can be utilized to amplify (e.g., boost) any signaling being generated by the network analyzer 860 to the first feed network 820 and/or the second feed network 830.

Figure 9:
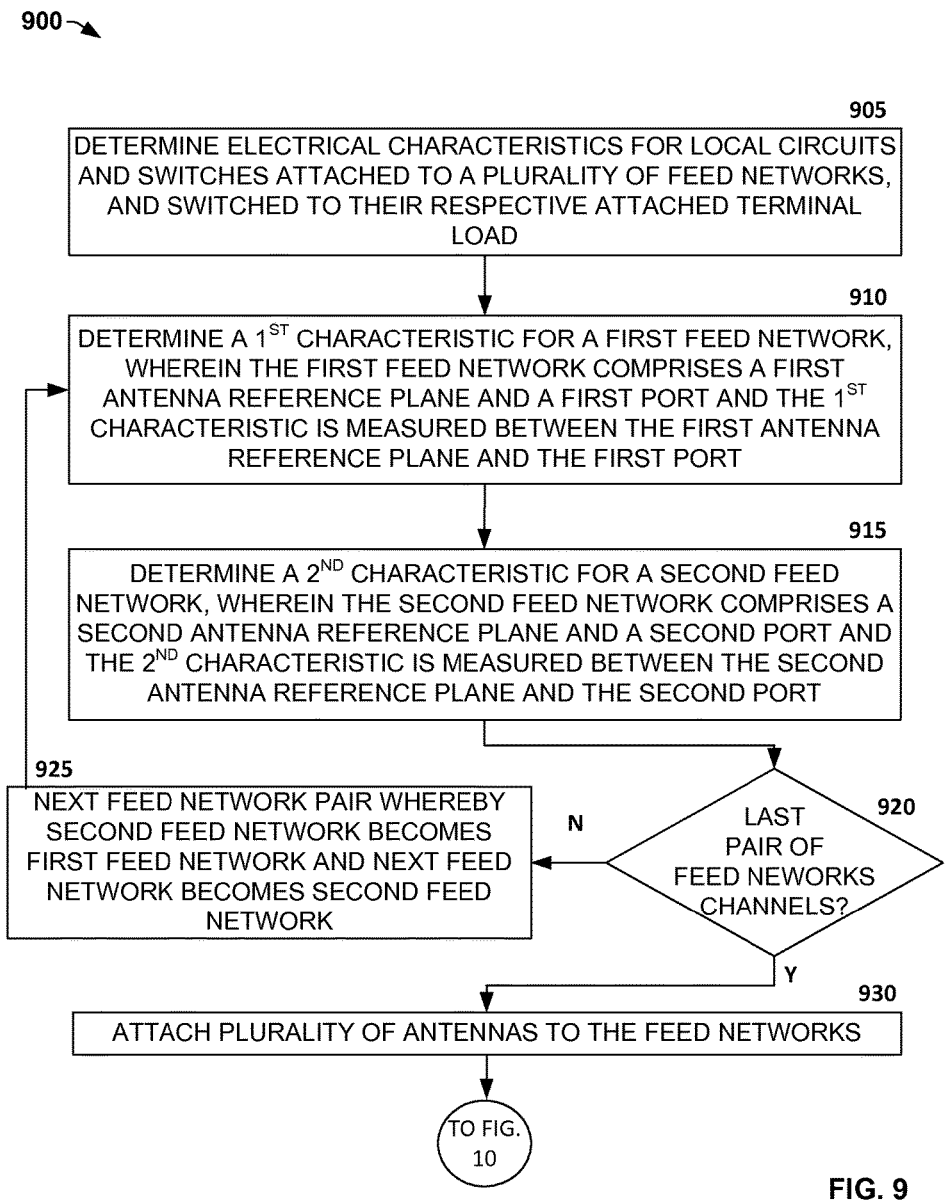
FIG. 9 is a flow diagram illustrating an exemplary methodology for determining mutual coupling between pairs of antenna elements in an array antenna.
Figure 10:
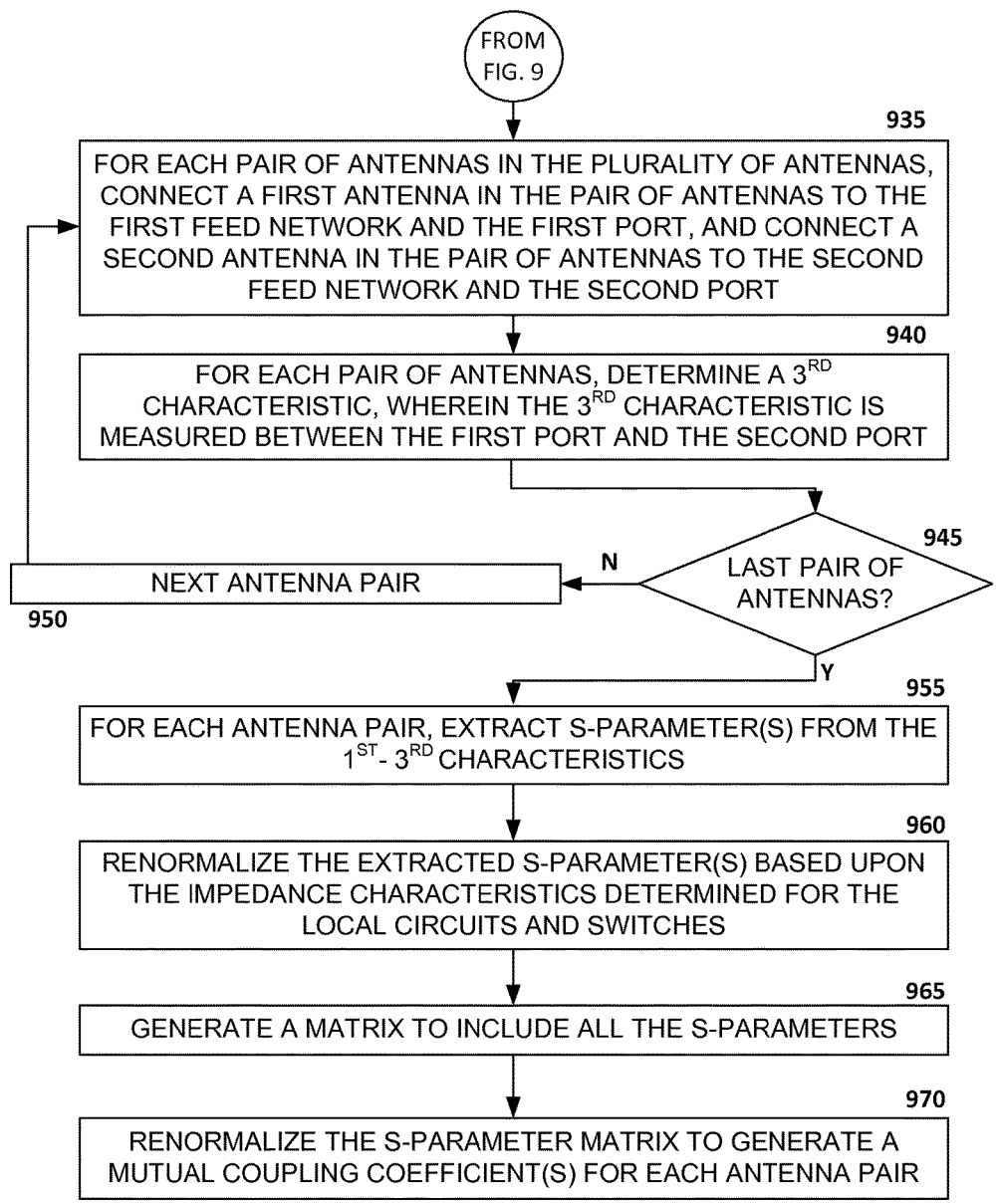
FIG. 10 is a continuation of the flow diagram of FIG. 9 illustrating an exemplary methodology for determining mutual coupling between pairs of antenna elements in an array antenna.

FIGS. 9 and 10 illustrate an exemplary methodology relating to determining mutual coupling between antenna elements in a phased array antenna. While the methodology is shown and described as being a series of acts that are performed in a sequence, it is to be understood and appreciated that the methodology is not limited by the order of the sequence. For example, some acts can occur in a different order than what is described herein. In addition, an act can occur concurrently with another act. Further, in some instances, not all acts may be required to implement the methodology described herein; e.g. some paths may use simulated data.

FIGS. 9 and 10 illustrate a methodology 900 relating to determining mutual coupling between antenna elements in a phased array antenna. The phased array antenna system can comprise of two respective circuits, a first circuit comprising a first feed network and a second circuit comprising a second feed network. A plurality of antennas can be respectively connected to the two respective circuits. A plurality of triple throw switches can be utilized to respectively connect each of the antennas to the two circuits. A first switch position of the switch connects an antenna to a first end of the first feed network (e.g., via a local circuit between the switch and the antenna), wherein a second end of the first feed network is a first port (α). A second switch position of the switch connects the antenna to a first end of the second feed network (e.g., via the local circuit), wherein a second end of the second feed network is a second port (β). A third switch position of each of the triple throw switches can connect each respective local circuit (e.g. an antenna reference plane, reference plane) and/or an antenna to a termination load. Per the following, a 2 channel network analyzer can be connected to respective positions of the first and second network to enable characterization of different portions of the first and second networks, to further enable determination of mutual coupling effects being engendered between a pair of antennas. As further described, the respective positions can include port α and/or port β, any of reference planes A, B, C, D, etc.

At 905, electrical characteristics are determined for the plurality of local circuits and switches without any antennas attached. To determine the electrical characteristics for each local circuit and switch, each respective switch is switched to the third switch position. For example, a first channel of a network analyzer is placed at a first end of a first local circuit (e.g., an antenna reference plane, respectively A, B, C, D of FIG. 1) and a second channel of the network analyzer is placed at a second end of a second local circuit (e.g., a load termination point of the local circuit). A first measurement can be made to determine a first local electrical characteristic of the first local circuit and the first switch. A second measurement can be made to determine the second local electrical characteristic of the second local circuit and the second switch. This operation can be repeated for all of the local circuits and switches in the plurality of local circuits and switches. The electrical characteristic(s) can be a termination impedance, $Z$, whereby the termination impedance can be based upon a termination value configured at the network analyzer. In an embodiment, the termination value can be 50Ω.

At 910, a 1st electrical characteristic between the first antenna reference plane and the first port (α) of the first feed network can be measured. The first electrical characteristic can be determined by connecting the first channel of the network analyzer to the first reference plane, connecting the second channel of the network analyzer to the first port, generating a first electrical signal at the first port and measuring a magnitude and phase of the first electrical signal at the first antenna reference plane. The 1st electrical characteristic can be a full 2-port measure αA from which $[S^{\alpha A}]$ can be determined (as previously described).

At 915, a 2nd electrical characteristic between the second antenna reference plane and the second port (β) of the second feed network can be measured. The 2nd electrical characteristic can be determined by connecting the first channel of the network analyzer to the second reference plane, connecting the second channel of the network analyzer to the second port, generating a second electrical signal at the second port and measuring a magnitude and phase of the second electrical signal at the second antenna reference plane. The 2nd electrical characteristic can be a full 2-port measure βB from which $[S^{\beta B}]$ can be determined (as previously described).

At 920, a determination can be made regarding whether each pair of network channels have been quantified. In response to NO, the methodology can advance to 925 such that respective switches are switched such that for each subsequent instance of acts 910 and 915, each channel (or path) between the first port and/or the second port and the respective reference planes are measured to facilitate determination of αA, αB, βC, βD, αB, βC, βD, αC (as previously described, per Table 1).

In response to a determination of YES at 920, the methodology can advance to 930. At 930 a plurality of antennas can be connected to the feed networks, whereby an antenna can be attached to each reference plane.

At 935, for each pair of antennas in the plurality of antennas, a first antenna can be connected to the first feed network, wherein connection is enabled by switching the switch associated with the first feed network to a first position (e.g., to connect the first antenna to the first feed network). Further, for each pair of antennas in the plurality of antennas, a second antenna can be connected to the second feed network, wherein connection is enabled by switching the switch associated with the second feed network to a first position (e.g., to connect the second antenna to the second feed network).

At 940, a 3rd electrical characteristic between the first antenna and the second antenna can be measured. The 3rd electrical characteristic can be determined by connecting the first channel of the network analyzer to the first feed network at port α, connecting the second channel of the network analyzer to the second feed network at port β, transmitting a third electrical signal at the first channel of the network analyzer connected to the first feed network and measuring a magnitude and phase of the third electrical signal received at the second channel of the network analyzer connected to the second feed network, wherein the third electrical signal is transmitted via the first antenna and the second antenna due to mutual coupling. The third electrical characteristic can be a full 2-port measure across the path αβ (as previously described).

At 945, a determination can be made regarding whether each pair of antennas (and their mutual coupling) have been measured. In response to a determination that NO the current antenna pair is not the last antenna pair, the methodology can advance to 950, whereby the acts 935 and 940 can be repeated for each antenna pair to enable respective mutual coupling effects to be determined for each antenna pair. For example, the second antenna can be switched (e.g., via the second switch) to be connected to the first feed network, and a third antenna can be connected to the second feed network. Hence, the second antenna can now be referred to as the first antenna in the antenna pair, and the third antenna can now be referred to as the second antenna in the antenna pair, in accordance with the operations outlined in acts 935 and 940. The third antenna can be switched to the second feed network via a third switch switching to connect the third antenna to the second feed network via a third local circuit. Steps 935 and 940 can be repeated until all of the antennas in the phased array antenna have had their respective mutual coupling characteristics determined. Accordingly, full 2-port measures across the path αβ via different antenna pairs, can be obtained (as previously described).

In response to a determination of YES at 945, the methodology can advance to 955. At 955, an S-parameter (e.g., $S^{\#1}$-$S^{\#6}$) can be determined for each respective antenna pairing. For example, a first mutual coupling can be determined between the first antenna and the second antenna, wherein the first mutual coupling can be based upon a relationship between the first electrical characteristic $[S^{\alpha A}]$, the second electrical characteristic $[S^{\beta B}]$, and the third electrical characteristic (e.g., between α-β) for the pairing of the first antenna and the second antenna.

In an aspect, the first electrical characteristic $[S^{\alpha A}]$+ second electrical characteristic $[S^{\beta B}]$ can be considered to be an electrical effect of the first network, the first switch, the first local circuit, the second network, the second switch, and the second local circuit upon the third electrical signal transmitted from the first antenna and the portion of the third electrical signal received at the second antenna.

At 960, the extracted S-parameters for each antenna pairing can undergo normalization based upon the termination impedances Z measured at 905 for the local circuit and switch of each antenna in the array antenna.

At 965, from the S-parameter determinations for each antenna pairing (e.g., in the previous example, $S^{\#1}$-$S^{\#6}$) a full 4-port S-parameter m×n matrix can be generated.

At 970, the full 4-port S-parameter m×n matrix can undergo normalization based upon the termination impedances Z measured at 905 for each antenna in the array antenna.

Figure 11:
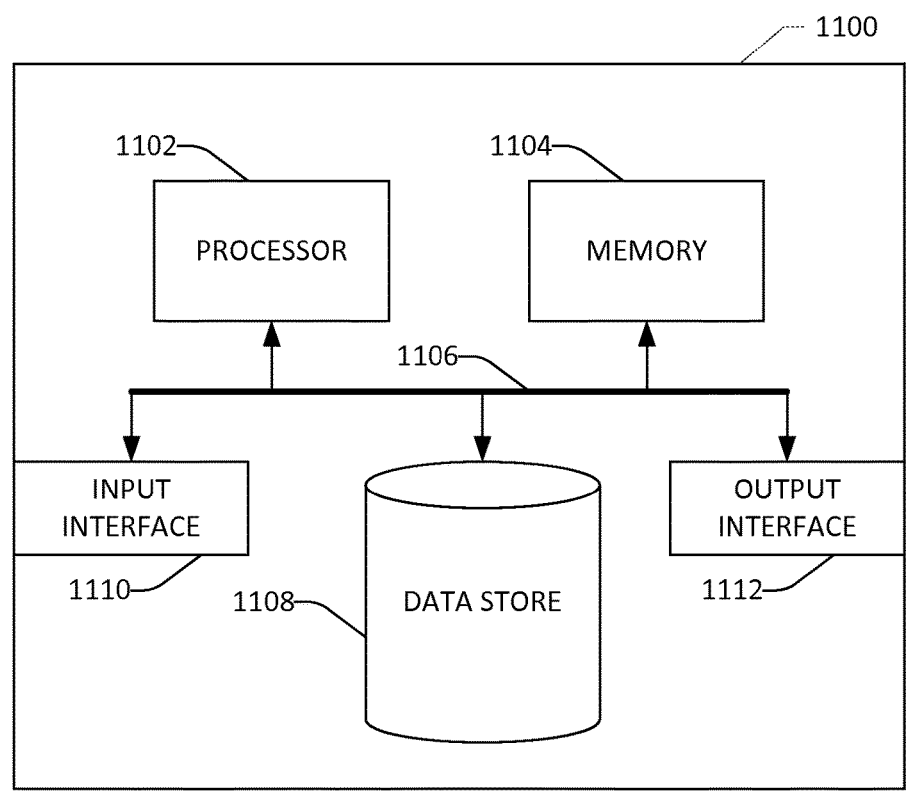
FIG. 11 illustrates an exemplary computing device.

Referring now to FIG. 11, a high-level illustration of an exemplary computing device 1100 that can be used in accordance with the systems and methodologies disclosed herein is illustrated. For instance, the computing device 1100 may be utilized to control measurement and determination of mutual coupling that exists between a plurality of antenna pairings in a phased array antenna. For example, computing device 1100 can operate as a controller 870 operating in conjunction with any of an algorithm 880, a mutual coupling coefficient 890, and/or a beam steering algorithm 895, as well as generating the mutual coupling coefficient 890. The computing device 1100 includes at least one processor 1102 that executes instructions that are stored in a memory 1104. The instructions may be, for instance, instructions for implementing functionality described as being carried out by one or more components discussed above or instructions for implementing one or more of the methods described above. The processor 1102 may access the memory 1104 by way of a system bus 1106. In addition to storing executable instructions, the memory 1104 may also store operating parameters, required operating parameters, and so forth.

The computing device 1100 additionally includes a data store 1108 that is accessible by the processor 1102 by way of the system bus 1106. The data store 1108 may include executable instructions, operating parameters, required operating parameters, etc. The computing device 1100 also includes an input interface 1110 that allows external devices to communicate with the computing device 1100. For instance, the input interface 1110 may be used to receive instructions from an external computer device, from a user, etc. The computing device 1100 also includes an output interface 1112 that interfaces the computing device 1100 with one or more external devices. For example, the computing device 1100 may display text, images, etc., by way of the output interface 1112.

Additionally, while illustrated as a single system, it is to be understood that the computing device 1100 may be a distributed system. Thus, for instance, several devices may be in communication by way of a network connection and may collectively perform tasks described as being performed by the computing device 1100.

As used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. The terms "component" and "system" are also intended to encompass hardware configured to cause certain functionality to be performed, where such hardware can include, but is not limited to including, Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Various functions described herein can be implemented in hardware, software, or any combination thereof. If implemented in software, the functions can be stored on or transmitted over as one or more instructions or code on a computer-readable medium. Computer-readable media includes computer-readable storage media. A computer-readable storage media can be any available storage media that can be accessed by a computer. By way of example, and not limitation, such computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and blu-ray disc (BD), where disks usually reproduce data magnetically and discs usually reproduce data optically with lasers. Further, a propagated signal is not included within the scope of computer-readable storage media. Computer-readable media also includes communication media including any medium that facilitates transfer of a computer program from one place to another. A connection, for instance, can be a communication medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio and microwave are included in the definition of communication medium. Combinations of the above should also be included within the scope of computer-readable media.

What has been described above includes examples of one or more embodiments. It is, of course, not possible to describe every conceivable modification and alteration of the above structures or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the details description or the claims, such term is intended to be inclusive in a manner similar to the term "comprising" as "comprising" is interpreted when employed as a transitional word in a claim.

What is claimed is:

1. A system comprising:
   a phased array antenna comprising a first antenna element and a second antenna element; and
   a control component configured to:
   determine a mutual coupling occurring between the first antenna element and the second antenna element during operation of the phased array antenna, whereby the first antenna element is transmitting a first signal and the second antenna element is transmitting a second signal, the first signal and second signal being coherently transmitted; and adjust transmission of the first signal at the first antenna element to compensate for the mutual coupling determined between the first antenna element and the second antenna element, the compensation of the mutual coupling enables the first signal and the second signal to be steered in accordance with a defined radiation pattern.

2. The system of claim 1, wherein the system further comprises:

a first feed network attached to the first antenna element, the first feed network is a corporate-fed network and has a first electrical characteristic; and a second feed network attached to the second antenna element, the second feed network is a corporate-fed network and has a second electrical characteristic.

3. The system of claim 2, wherein the control component is further configured to:

receive a measurement indicating a magnitude and phase of a portion of the first signal received at the second antenna element;

determine the mutual coupling between the first antenna element and the second antenna element based upon the magnitude and phase of the portion of the first signal received at the second antenna element in relation to a magnitude and phase of the first signal; and correct the determined mutual coupling based upon at least one of the first electrical characteristic or the second electrical characteristic.

4. The system of claim 2, wherein:

the first electrical characteristic is a first impedance measured for the first feed network; and the second electrical characteristic is a second impedance measured for the second feed network.

5. The system of claim 2, further comprising:

a first switch, the first switch is in a first switch position to connect the first antenna element to the first feed network, the first switch having a second switch position to enable connection of the first antenna element to the second feed network and the first switch having a third switch position to ground via a termination resistance.

6. The system of claim 2, further comprising:

a second switch, the second switch is in a fourth switch position to connect the second antenna element to the second feed network, the second switch having a fifth switch position to enable connection of the second antenna element to the first feed network and the second switch having a sixth switch position to ground via a termination resistance.

7. The system of claim 2, further comprising computer-readable data storage, the computer-readable data storage comprises a look up table, the look up table configured to store the first electrical characteristic and the second electrical characteristic, whereby the first electrical characteristic and the second electrical characteristic are stored at the look up table prior to the operation of the phased array antenna.

8. The system of claim 2, further comprising an amplifier, wherein the amplifier is configured to amplify at least one of the first signal being transmitted on the first feed network or the second signal being transmitted on the second feed network.

9. The system of claim 1, wherein the adjustment of the transmission of the first signal at the first antenna element is a change in phase of the first signal relative to the second signal.

* * * * *